US006909336B1

United States Patent
Rajagopalan et al.

(10) Patent No.: US 6,909,336 B1
(45) Date of Patent: Jun. 21, 2005

(54) DISCRETE-TIME AMPLITUDE CONTROL OF VOLTAGE-CONTROLLED OSCILLATOR

(75) Inventors: Jayendar Rajagopalan, Newcastle, WA (US); Rob Butler, Issaquah, WA (US)

(73) Assignee: National Semiconductor Corporation, Santa Clara, CA (US)

( * ) Notice: Subject to any disclaimer, the term of this patent is extended or adjusted under 35 U.S.C. 154(b) by 105 days.

(21) Appl. No.: 10/654,318

(22) Filed: Sep. 3, 2003

(51) Int. Cl.[7] .............................. H03B 5/00; H03B 5/04; H03B 5/12
(52) U.S. Cl. .................. 331/183; 331/109; 331/117 R; 331/186
(58) Field of Search ............................ 331/109, 117 R, 331/117 FE, 117 D, 182, 183, 185, 186

(56) References Cited

U.S. PATENT DOCUMENTS

| | | | | |
|---|---|---|---|---|
| 3,621,465 A | * | 11/1971 | Beaty ...................... | 331/107 T |
| 4,058,809 A | * | 11/1977 | Chudleigh, Jr. .............. | 342/92 |
| 5,001,649 A | * | 3/1991 | Lo et al. ...................... | 702/124 |
| 6,667,663 B2 | * | 12/2003 | Ozawa ........................ | 331/17 |

OTHER PUBLICATIONS

Margarit, Mihai A., et al, "A Low–Noise, Low–Power VCO With Automatic Amplitude Control for Wireless Applications," IEEE Journal of Solid–State Circuits, vol. 34, No. 6, Jun. 1999, pp. 761–771.

Rogers, John W.M., et al., "A Study of Digital and Analog Automatic–Amplitude Control Circuitry for Voltage–Controlled Oscillators," IEEE Journal of Solid–State Circuits, vol. 38, No. 2, Feb. 2003, pp. 352–356.

* cited by examiner

Primary Examiner—David Mis

(57) ABSTRACT

Periodically, sensed amplitude for the output signal of a voltage-controlled oscillator is compared to a reference and biasing of the voltage-controlled oscillator is correspondingly set, thereby controlling amplitude of the voltage-controlled oscillator output signal. Process and temperature dependencies of the amplitude are eliminated while achieving low phase noise and large signal-to-noise ratio in the output signal, and consequently low phase noise.

20 Claims, 2 Drawing Sheets

DISCRETE-TIME AMPLITUDE CONTROL OF VOLTAGE-CONTROLLED OSCILLATOR

TECHNICAL FIELD OF THE INVENTION

The present invention is directed, in general, to high performance frequency synthesizers and, more specifically, to low phase noise voltage-controlled oscillators suitable for use in high performance frequency synthesizers.

BACKGROUND OF THE INVENTION

Voltage-controlled oscillators (VCOs) within portable communication devices such as mobile telephones and other wireless devices, must exhibit low phase noise by having the largest possible signal amplitude while ensuring that devices operate within the maximum permissible voltage amplitudes. Operating the devices within voltage limits helps to increase device reliability as well as minimize the noise generated in the active devices.

Continuous-time amplitude control for voltagecontrolled oscillators has been proposed, but requires a trade-off between speed of operation and phase noise degradation resulting from low frequency bias modulation within the amplitude control loop. In addition, temperature and fabrication process variations constrain phase noise performance.

There is, therefore, a need in the art for improved amplitude control within a voltage controlled oscillator.

BRIEF DESCRIPTION OF THE DRAWINGS

For a more complete understanding of the present invention, and the advantages thereof, reference is now made to the following descriptions taken in conjunction with the accompanying drawings, wherein like numbers designate like objects, and in which.

DETAILED DESCRIPTION OF THE INVENTION

To address the above-discussed deficiencies of the prior art, it is a primary object of the present invention to provide, for use in a transceiver for a wireless communications system, a mechanism that, periodically, compares the sensed amplitude for the output signal of a voltage-controlled oscillator to a reference and sets biasing of the voltage-controlled oscillator is correspondingly, thereby controlling amplitude of the voltage-controlled oscillator output signal. Process and temperature dependencies of the amplitude are eliminated while achieving low phase noise and large signal-to-noise ratio in the output signal, and consequently low phase noise.

The foregoing has outlined rather broadly the features and technical advantages of the present invention so that those skilled in the art may better understand the detailed description of the invention that follows. Additional features and advantages of the invention will be described hereinafter that form the subject of the claims of the invention. Those skilled in the art will appreciate that they may readily use the conception and the specific embodiment disclosed as a basis for modifying or designing other structures for carrying out the same purposes of the present invention. Those skilled in the art will also realize that such equivalent constructions do not depart from the spirit and scope of the invention in its broadest form.

Before undertaking the DETAILED DESCRIPTION OF THE INVENTION below, it may be advantageous to set forth definitions of certain words or phrases used throughout this patent document: the terms "include" and "comprise," as well as derivatives thereof, mean inclusion without limitation; the term "or" is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, whether such a device is implemented in hardware, firmware, software or some combination of at least two of the same. It should be noted that the functionality associated with any particular controller may be centralized or distributed, whether locally or remotely. Definitions for certain words and phrases are provided throughout this patent document, and those of ordinary skill in the art will understand that such definitions apply in many, if not most, instances to prior as well as future uses of such defined words and phrases.

Figure 1:
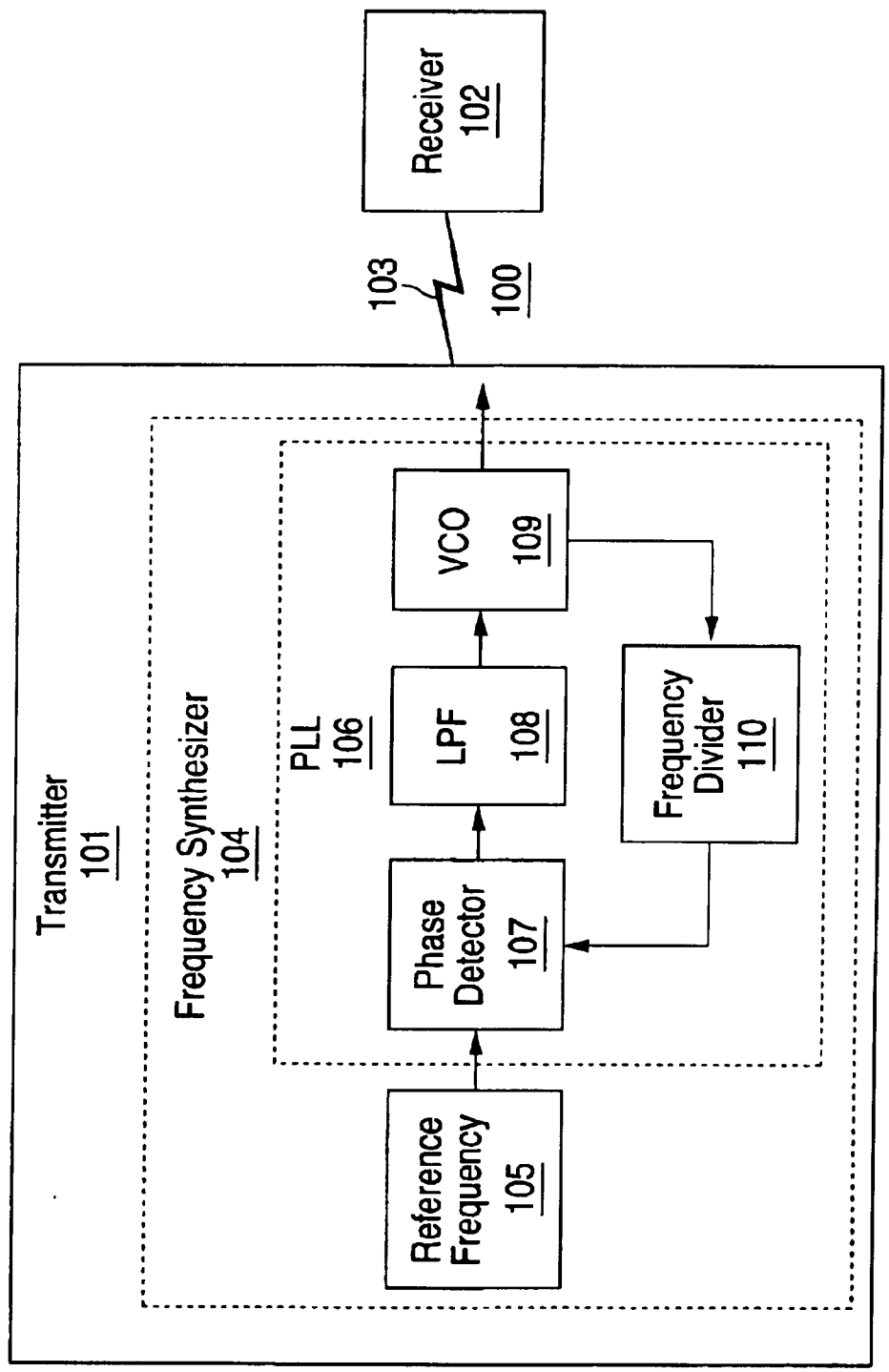
FIG. 1 depicts a wireless communications system employing a phase lock loop-based frequency synthesizer with a voltage-controlled oscillator with discrete-time amplitude control according to one embodiment of the present invention.
Figure 2:
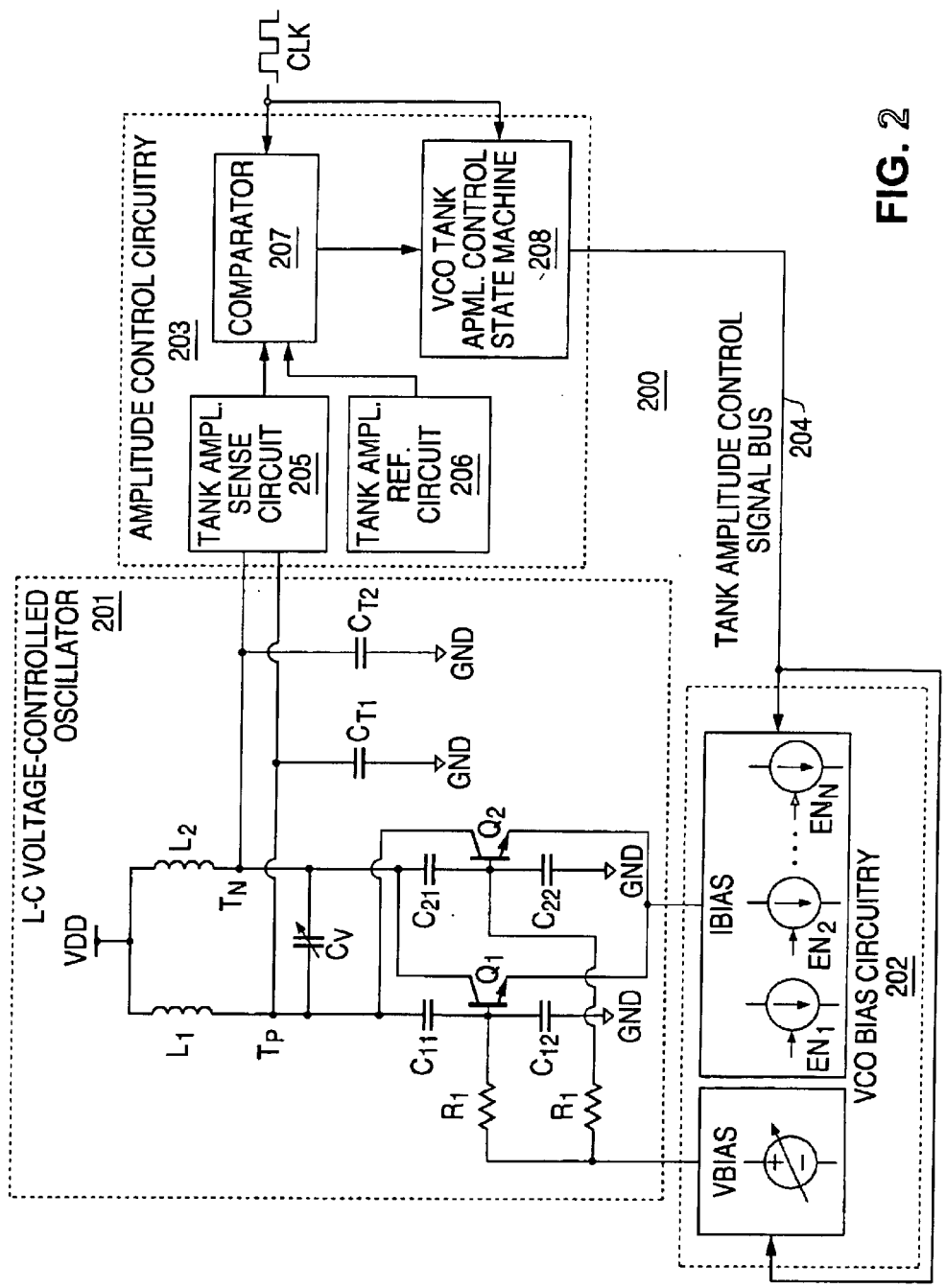
FIG. 2 depicts in greater detail a voltagecontrolled oscillator with discrete-time amplitude control according to one embodiment-of the present invention.

FIGS. 1 and 2, discussed below, and the various embodiments used to describe the principles of the present invention in this patent document are by way of illustration only and should not be construed in any way to limit the scope of the invention. Those skilled in the art will understand that the principles of the present invention may be implemented in any suitably arranged device.

FIG. 1 depicts a wireless communications system employing a phase lock loop-based frequency synthesizer with a voltage-controlled oscillator with discrete-time amplitude control according to one embodiment of the present invention. Wireless communications system 100 includes a transmitter 101 and receiver 102 (or transceiver pair), and at least one communications channel 103 communicably coupling the transmitter 101 and receiver 102. Wireless communications system 100 may be employed for voice communications, video transmission or data transmission. Accordingly, receiver (or transceiver) 102 may be, for example, a mobile telephone, a satellite or terrestrial television receiver, a data processing system such as a wireless personal digital assistant (PDA) with Internet access capabilities, or some combination thereof.

Those skilled in the art will recognize that the complete structure and operation of a wireless communications system or a receiver therein are not depicted or described herein. Instead, for simplicity and clarity, only so much of a wireless communications system and associated receiver as is unique to the present invention or necessary for an understanding of the present invention is depicted and described.

A phase lock loop (PLL)-based frequency synthesizer 104 is commonly used in communication and control systems. The frequency synthesizer 104 provides a programmable, highly stable signal of the desired frequency, phase noise and power level. The frequency synthesizer 104 consists of a high quality, low-frequency external quartz crystal oscillator 105 whose output signal is the reference to the phase lock loop 106. That reference signal is used to derive a higher frequency signal through frequency multiplication. The error between the reference signal and the actual synthesized frequency output signal is detected by a phase detector 107 and averaged through a low-pass filter (LPF) 108. The averaged signal forms the control input to a voltage-controlled oscillator 109, with a frequency divider (counter) 110 within the feedback loop.

Phase noise characteristics of the frequency synthesizer for frequencies greater than the PLL loop bandwidth (with respect to the synthesized carrier frequency) is determined by the phase noise of the VCO 109. The requirement for low phase noise at offset frequencies greater than the loop bandwidth is very important for receiver and transmitter performance in wireless communications systems. In the present invention, the voltage-controlled oscillator 109 employs discrete-time amplitude control as described in further detail below. Additionally, while frequency synthesizer 104 is depicted within the transmitter 101 within the exemplary embodiment of FIG. 1, the same structure may also be implemented within receiver 102.

FIG. 2 depicts in greater detail a voltagecontrolled oscillator with discrete-time amplitude control according to one embodiment of the present invention. Voltage-controlled oscillator and control system 200 includes an inductive-capacitive (L-C) voltage-controlled oscillator 201, bias controller 202 for biasing the voltage-controlled oscillator 201 and thereby controlling the gain and the amplitude of the output signal from the voltage-controlled oscillator 201, and a discrete-time amplitude controller 203 passing amplitude control signals to the bias controller 202 on an amplitude control signal bus 204.

In the exemplary embodiment, differential voltage-controlled oscillator 201 includes an L-C tank circuit formed by identical inductors $L_1$ and $L_2$, capacitors $C_{T1}$ and $C_{T2}$, and voltage-controlled varactor $C_V$, together with cross-coupled transistors $Q_1$, and $Q_2$ and feedback capacitive voltage dividers $C_{11}$, $C_{12}$ and $C_{21}$, $C_{22}$ from the L-C tank to the transistors $Q_1$ and $Q_2$. Inductors $L_1$ and $L_2$ are both connected at one end to a power supply voltage VDD and at the other end to one terminal of varactor $C_V$, with the connections between the inductors $L_1$ and $L_2$ and varactor $C_V$ forming the output nodes $T_N$ and $T_P$ of the L-C tank.

Voltage dividers $C_{11}$, $C_{12}$ and $C_{21}$, $C_{22}$ are connected between output nodes $T_P$ and $T_N$, respectively, and a ground voltage GND. The base of transistor $Q_1$ is connected to the junction between capacitors $C_{11}$, and $C_{12}$, and the base of transistor $Q_2$ is connected to the junction between capacitors $C_{21}$ and $C_{22}$. Also connected to the junction between capacitors $C_{11}$ and $C_{12}$ is one end of resistor $R_1$, and connected to the junction between capacitors $C_{21}$, and $C_{22}$ is one end of resistor $R_2$. The other ends of resistors $R_1$ and $R_2$ are connected to a voltage generated by voltage bias circuit VBIAS within bias circuitry 202.

Inductors $L_1$ and $L_2$, capacitors $C_{T1}$ and $C_{T2}$, transistors $Q_1$ and $Q_2$, capacitors $C_{11}$ and $C_{21}$, capacitors $C_{12}$ and $C_{22}$, and resistors $R_1$ and $R_2$ are each respectively matched in size and electrical characteristics. While a push-pull configuration for the voltage-controlled oscillator 201 is employed in the exemplary embodiment, the present invention may be implemented within published VCO topologies for either single-ended or differential operation, with bipolar junction transistors, metal-oxide-semiconductor transistors, or any other active devices that provide the negative transconductance to compensate for losses within the L-C tank.

Through resistors $R_1$ and $R_2$, transistors $Q_1$ and $Q_2$ are biased at the direct current voltage set by circuit VBIAS within bias circuitry 202. Circuit IBIAS in the exemplary embodiment contains N parallel current sources that are individually enabled by enable signals $EN_1$, through $EN_N$, with transistors $Q_1$ and $Q_2$ biased at current levels set by circuit IBIAS. Accordingly, for given inductances of inductors $L_1$ and $L_2$ and capacitances of capacitors $C_{T1}$, $C_{T2}$, $C_V$, $C_{11}$, $C_{21}$, $C_{12}$ and $C_{22}$, the amplitude of the tank signal at the output nodes $T_N$ and $T_P$ is determined by the voltage set by circuit VBIAS and the current set by circuit IBIAS. The frequency of the voltage-controlled oscillator 201 is determined by (a) the inductance of inductors $L_1$ and $L_2$ and (b) the net capacitance at the output nodes $T_N$ and $T_P$, which varies based on the capacitance of varactor $C_V$.

Bias circuitry 202 includes VBIAS and IBIAS cells. Circuit IBIAS sets the tail current of the coupledemitter, cross-coupled transistor pair $Q_1$ and $Q_2$ and may be a set of current mirrors as depicted or a set of switchable resistors. Circuit VBIAS sets the direct current base voltage which controls the switching interval of the crosscoupled transistors $Q_1$ and $Q_2$ and the operating region of the IBIAS cell, and therefore control the current through the transistors $Q_1$ and $Q_2$.

Amplitude control circuitry 203 includes a tank output amplitude sense circuit 205 receiving the differential output from output nodes $T_N$ and $T_P$ sensing the tank amplitude and generating a signal representative of the output amplitude from L-C tank voltage-controlled oscillator 201 and a tank amplitude reference circuit 206 generating a signal representative of the desired tank amplitude. Comparator 207 periodically compares the out-puts of tank amplitude sense circuit 205 and tank amplitude reference circuit 206, triggered by a clock signal CLK.

The output of the comparator 207 (a high or low signal) is processed by a logic state machine 208 implementing algorithms ensuring that (a) the voltage-controlled oscillator 201 has the minimum current required for start up, and (b) the VBIAS and IBIAS cells are switched to provide the desired values of bias quantities such that the desired tank amplitude is obtained. Voltage-controlled oscillator tank amplitude control state machine 208 controls the VBIAS and IBIAS circuits via tank amplitude control signal bus 204. State machine 208 updates the control signals on tank amplitude control signal bus 204 on a periodic basis, triggered by clock signal CLK.

The present invention employs a tank voltage sense circuit, a reference tank voltage signal, and a clocked comparator to compare the sensed and reference signals, and a clocked state machine employing an algorithm to increase or decrease the tank bias current and voltage in discrete steps. Unlike a continuous-time sensing and amplitude control scheme, the discrete-time amplitude control scheme of the present invention does not involve an inherent trade-off between speed of operation and phase noise degradation due to low-frequency bias modulation.

The amplitude control scheme of the present invention operates during the calibration phase. After completion of the calibration phase, the oscillator bias conditions are held constant. However, the amplitude control operation may be performed as frequently as desired to eliminate both process and temperature dependencies of the voltage-controlled oscillator tank amplitude.

The discrete-time amplitude control system of the present invention obtains the lowest possible phase noise within a voltage-controlled oscillator with the largest possible signal-to-noise ratio within the L-C tank signal, biasing the tank such that the largest possible signal subject to biasing is obtained and operating the various active devices in their low-noise region. The oscillator operates in the mode described without introduction by the amplitude control scheme of any mechanisms causing degradation of the oscillator phase noise, as found in continuous-time amplitude control feedback schemes. Accordingly, the present invention achieves the best possible phase noise over fabrication process and temperature variation without phase noise degradation due to modulation of bias by the amplitude control loop.

Although the present invention has been described in detail, those skilled in the art will understand that various changes, substitutions, variations, enhancements, nuances, gradations, lesser forms, alterations, revisions, improvements and knock-offs of the invention disclosed herein may be made without departing from the spirit and scope of the invention in its broadest form.

What is claimed is:

1. A voltage-controlled oscillator discrete-time amplitude control system comprising:
   a voltage-controlled oscillator; and
   a control circuit sensing an amplitude of an output of the voltage-controlled oscillator and adjusting operation of the voltage-controlled oscillator, if necessary, at discrete intervals.

2. The voltage-controlled oscillator discrete-time amplitude control system according to claim 1, further comprising:
   a bias circuit setting at least one of a voltage bias and a current bias for the voltage-controlled oscillator under control of the control circuit.

3. The voltage-controlled oscillator discrete-time amplitude control system according to claim 2, wherein control of the voltage bias or the current bias adjusts the amplitude of the output of the voltage-controlled oscillator.

4. The voltage-controlled oscillator discrete-time amplitude control system according to claim 2, wherein the control circuit further comprises:
   a comparator periodically comparing the amplitude of the output of the voltage-controlled oscillator to a reference amplitude; and
   logic increasing or decreasing the voltage bias or the current bias based upon an output signal of the comparator responsive to comparison of the amplitude of the output of the voltage-controlled oscillator to the reference amplitude.

5. The voltage-controlled oscillator discrete-time amplitude control system according to claim 1, wherein the control circuit adjusts operation of the oscillator only during a calibration phase, holding operation of the voltage-controlled oscillator constant after completion of the calibration phase.

6. The voltage-controlled oscillator discrete-time amplitude control system according to claim 1, wherein the voltage-controlled oscillator produces a differential output signal.

7. A wireless transmitter including the voltage-controlled oscillator discrete-time amplitude control system according to claim 1, the wireless transmitter further comprising:
   a low noise amplifier operating on a wireless signal in conjunction with the voltage-controlled oscillator; and
   a modulator operating on the wireless signal.

8. A wireless communications system including the wireless transmitter according to claim 7, the wireless communications system further comprising:
   a receiver receiving the wireless signal.

9. A wireless transceiver including the wireless transmitter according to claim 7, the wireless transceiver further comprising:
   a receiver operating on a second wireless signal forming a communications channel with the wireless signal.

10. A method of discrete-time amplitude control system for a voltage-controlled oscillator, the method comprising:
    operating a voltage-controlled oscillator; and
    sensing an amplitude of an output of the voltage-controlled oscillator and adjusting operation of the voltage-controlled oscillator, if necessary, at discrete intervals.

11. The method according to claim 10, further comprising:
    setting at least one of a voltage bias and a current bias for the voltage-controlled oscillator under control of the control circuit.

12. The method according to claim 11, wherein control of the voltage bias or the current bias adjusts the amplitude of the output of the voltage-controlled oscillator.

13. The method according to claim 11, further comprising:
    periodically comparing the amplitude of the output of the voltage-controlled oscillator to a reference amplitude; and
    increasing or decreasing the voltage bias or the current bias based upon an output signal of the comparator responsive to comparison of the amplitude of the output of the voltage-controlled oscillator to the reference amplitude.

14. The method according to claim 10, further comprising:
    adjusting operation of the oscillator only during a calibration phase; and
    holding operation of the voltage-controlled oscillator constant after completion of the calibration phase.

15. The method according to claim 10, wherein operation of the voltage-controlled oscillator produces a differential output signal.

16. A voltage-controlled oscillator discrete-time amplitude control system comprising:
    a voltage-controlled oscillator producing a differential output signal;
    a control circuit sensing an amplitude of the output signal and generating a control signal for controlling biasing of the voltage-controlled oscillator; and
    a biasing circuit biasing the voltage-controlled oscillator based upon the control signal,
    wherein the biasing of the voltage-controlled oscillator is adjusted, if necessary, at a predetermined point within a recurring period.

17. The system according to claim 16, wherein adjustment of the biasing of the voltage-controlled oscillator sets the amplitude of the output signal.

18. The system according to claim 16, wherein the biasing circuit further comprises:
    a voltage bias circuit for setting a voltage bias of the voltage controlled oscillator; and
    a current bias circuit setting a current through the voltage-controlled oscillator.

19. The system according to claim 16, wherein the voltage-controlled oscillator further comprises:
    an inductive-capacitive tank circuit including a voltage-variable capacitance;

a voltage divider coupled to output nodes of the tank circuit; and a coupled-emitter, cross-coupled pair of transistors coupled to the voltage divider and providing negative transconductance compensating for losses within the tank circuit.

20. The system according to claim 16, wherein setting of the amplitude of the output signal eliminates process and temperature dependencies of the amplitude.

* * * * *

UNITED STATES PATENT AND TRADEMARK OFFICE
CERTIFICATE OF CORRECTION

PATENT NO. : 6,909,336 B1
DATED : June 21, 2005
INVENTOR(S) : Jayendar Rajagopalan and Rob Butler It is certified that error appears in the above-identified patent and that said Letters Patent is hereby corrected as shown below:

Column 1,
Lines 21 and 42, delete "voltagecontrolled" and replace with -- voltage-controlled --;
Line 44, delete "-" after "embodiment";

Column 3,
Line 22, delete "voltagecontrolled" and replace with -- voltage-controlled --;

Column 4,
Line 15, delete "coupledemitter" and replace with -- coupled-emitter --;
Line 19, delete "crosscoupled" and replace with -- cross-coupled --.

Signed and Sealed this

Fourteenth Day of February, 2006

JON W. DUDAS
*Director of the United States Patent and Trademark Office*